(12) United States Patent
Bates, Jr.

(10) Patent No.: US 8,154,028 B2
(45) Date of Patent: Apr. 10, 2012

(54) INFRARED EXTERNAL PHOTOEMISSIVE DETECTOR

(75) Inventor: Clayton W. Bates, Jr., Silver Spring, MD (US)

(73) Assignee: Howard University, Washington, DC (US)

( * ) Notice: Subject to any disclaimer, the term of this patent is extended or adjusted under 35 U.S.C. 154(b) by 256 days.

(21) Appl. No.: 12/695,188

(22) Filed: Jan. 28, 2010

(65) Prior Publication Data

US 2011/0180807 A1    Jul. 28, 2011

(51) Int. Cl.
*H01L 29/15* (2006.01)
(52) U.S. Cl. .......... 257/77; 257/183; 257/200; 257/201; 257/473; 257/E31.011
(58) Field of Classification Search ............ 257/77, 257/183, 200, 201, 473, E31.011
See application file for complete search history.

(56) References Cited

U.S. PATENT DOCUMENTS

| | | | |
|---|---|---|---|
| 5,476,812 A * | 12/1995 | Kimoto et al. | 438/47 |
| 5,576,561 A * | 11/1996 | Colella et al. | 257/217 |
| 2006/0065833 A1 | 3/2006 | Craig et al. | |
| 2007/0215860 A1 | 9/2007 | Komiyama et al. | |
| 2009/0250110 A1 | 10/2009 | Yu et al. | |
| 2010/0326509 A1 * | 12/2010 | Kruglick | 136/256 |

FOREIGN PATENT DOCUMENTS

| | | |
|---|---|---|
| EP | 0106514 A2 | 4/1984 |
| WO | WO 2004-077526 A2 | 9/2004 |

OTHER PUBLICATIONS

PCT/US2011/022948 Search Report; 2011.

* cited by examiner

*Primary Examiner* — Tan N Tran
(74) *Attorney, Agent, or Firm* — Fitch, Even, Tabin & Flannery, LLP

(57) ABSTRACT

An infrared external photoemissive detector can have an n-p heterojunction comprising an n-type semiconductor layer and a p-layer; the n-layer semiconductor comprising doped silicon embedded with nanoparticles forming Schottky barriers; and the p-layer is a p-type diamond film. The nanoparticles can be about 20-30 atomic percentage metal particles (such as silver) having an average particle size of about 5-10 nm. The p-layer can have a surface layer that has a negative electron affinity. The n-layer can be in the range of about 3 μm to 10 μm thick, and preferably about 3 μm thick. The doped silicon can be doped with elements selected from the list consisting of phosphorus and antimony.

7 Claims, 1 Drawing Sheet

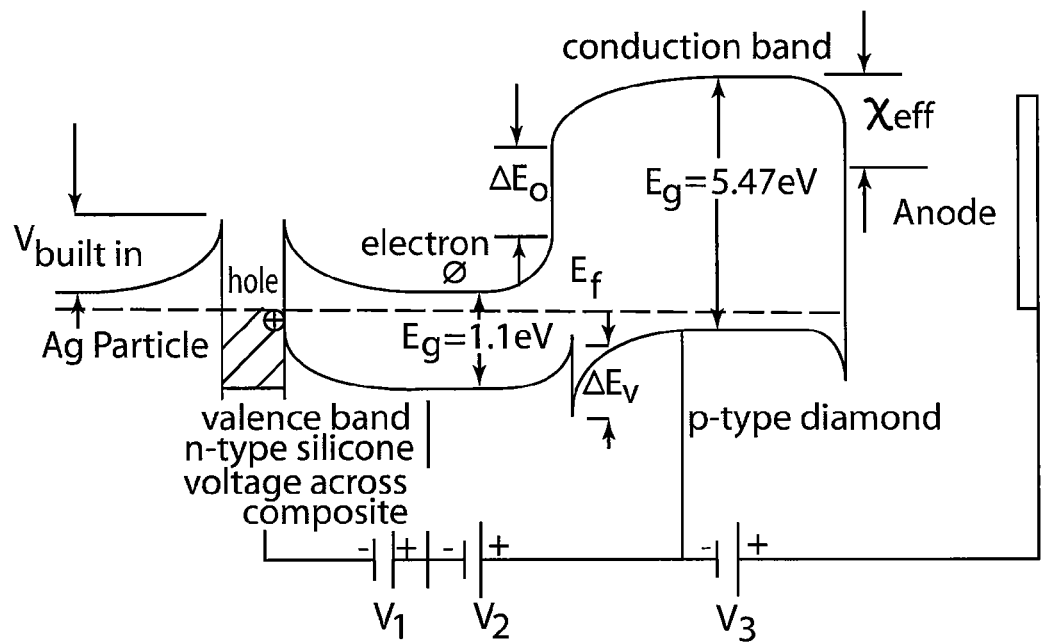

INFRARED EXTERNAL PHOTOEMISSIVE DETECTOR

FIELD

The present device and methods generally relate to photoemissive detectors, and specifically to infrared external photoemissive detectors using silver nanoparticles in n-type silicon composites.

BACKGROUND

External photoemitters (or photocathodes) are known in the art as a means to detect optical radiation. These types of detectors can be used, by way of example, in image intensifiers for light amplification in the visible part of the electromagnetic spectrum. Practical applications can include their use in night vision devices such as binoculars, scopes and goggles, infrared viewers, streak camera tubes for high speed photography, and the like.

Some applications can use photocathodes with multichannel plates (MCPs) to detect low levels of electromagnetic radiation from a photocathode surface. MPCs can accelerate electrons but coming from the photocathode, provide gain.

Recent advances have included high efficiency III-V negative electron affinity photocathodes. These devices can be especially sensitive to their surroundings and must be developed within an ultra-high vacuum to achieve maximum sensitivity. These devices are also limited to detecting wavelengths no longer than about 2 µm due to the formation of a heterojunction barrier at the surface that is formed. An example of this type of device has worked for field-assisted photoemission using p-InGaAs.

While there have been significant advances in the art, further advances are possible and desired. It would be desirable to have an external photoemissive detection and processing where wavelengths beyond 2 µm are possible. For example, it would be desirable to detect radiation from 1-20 microns.

Further, atmospheric windows are ranges of electromagnetic radiation wavelengths that are allowed to easily pass through the atmosphere to Earth's surface. This is in contrast to EM wavelengths that are absorbed by atmospheric gases such as water vapor, carbon dioxide and ozone, known as absorption bands. It would be desirable to efficiently detect radiation within multiple atmospheric windows, such as those at 1-2 µm, 3-5 µm and 8-14 µm. This could be especially valuable if this type of detection could be accomplished with a single film of material.

Additional improvements could be a simplification of manufacturing, such as the ability to produce these types of detectors under modest vacuum conditions and be capable of exposure to atmospheric conditions for extended periods without essentially compromising its operation. Such a device could be readily manufactured with an added benefit of reduced need for toxic materials.

SUMMARY

Accordingly, there is provided herein a device and methods of an external photoemissive infrared detector using a silver n-type silicon composite. The device is able to detect wavelengths greater than 2 µm. Using a single film of material, the present device can efficiently detect radiation atmospheric windows, such as 1-2 µm, 3-5 µm and 8-14 µm. The present device can be prepared under very modest vacuum conditions and is capable of exposure to atmospheric conditions for extended periods without compromising its operation. The device is readily manufactured and does not involve toxic materials.

In one embodiment, an infrared external photoemissive detector can have an n-p heterojunction comprising an n-type semiconductor layer and a p-layer; the n-layer semiconductor comprising doped silicon embedded with nanoparticles forming Schottky barriers; and the p-layer is a p-type diamond film. The nanoparticles can be about 20-30 atomic percentage metal particles (such as silver) having an average particle size of about 5-10 nm. The p-layer can have a surface layer that has a negative electron affinity. The n-layer can be in the range of about 3 µm to 10 µm thick, and preferably about 3 µm thick. The doped silicon can be doped with elements selected from the list consisting of phosphorus and antimony.

Other features will become more apparent to persons having ordinary skill in the art to which it pertains from the following description and claims.

BRIEF DESCRIPTION OF THE FIGURE

The foregoing features, as well as other features, will become apparent with reference to the description and FIGURE, and in which the FIGURE is an electron energy band diagram for an Ag/n-type silicon-p-type diamond.

DETAILED DESCRIPTION

The present device and methods generally relate to photoemissive detectors, and specifically to an infrared external photoemissive detector using silver nanoparticles in n-type silicon composites and is able to detect wavelengths greater than 2 µm. Using a single film of material, the present device is able to efficiently detect radiation in all three atmospheric windows, namely 1-2 µm, 3-5 µm and 8-14 µm. The present device can be prepared under very modest vacuum conditions and is capable of exposure to atmospheric conditions for extended periods without compromising its operation. The device is readily manufactured and does not involve toxic materials. Also, thermal imaging could be performed using these materials in a conventional image intensifier tube, avoiding the complexities of a pyroelectric vidicon.

The basic scheme for the detection of radiation employing the external photoemissive mode is described with the aid of the FIGURE. As shown, radiation incident on the photocathode releases electrons, which are accelerated by a battery potential and collected in an external circuit as a signal current. The smallest energy that can be detected by the photocathode is a function of the properties of a bandgap (e.g., the material of which the photocathode is made). The smaller the bandgap the smaller the energy of the radiation that may be detected. Various compound semiconductors may be constructed by varying the relative amounts of the constituents to produce semiconductors with bandgaps varying from 0 electron volts up to over 1 electron volt, suggesting that this method may be employed to detect radiation at very long wavelengths. Unfortunately, this has only been demonstrated for detecting wavelengths no longer than about 2 µm. The reason for this is that the photocathode surface must be treated with a coating of cesium and oxygen to lower the surface energy to allow the electrons to escape into a vacuum. These layers must be prepared with great care in a very high vacuum. The cesium-oxygen compound forms a heterojunction with the semiconductor material and for low bandgap semiconductors the conduction band minimum of the semiconductor drops below the interfacial barrier preventing photoemission. This occurs for semiconductors with bandgaps near 0.63 electron volts (2 μm). The external photoemissive scheme of the present invention, described below, avoids the limitations of the heterojunction barrier and the necessity of keeping the detector under good vacuum during its operating life. The external photoemissive mode of detection is a highly desirable one because it is fast ~$10^{-10}$ seconds and one can obtain high gains ($10^{+5}$) with low noise, allowing in some instances the detection of single photon events.

Specifically, the proposed detector as shown in the FIGURE, can have an n-p heterojunction with the n-layer doped with an element such as phosphorus or antimony and also have embedded silver (Ag) nanoparticles approximately 5-10 nm in size, distributed throughout an n-type silicon matrix forming buried Schottky barriers. The atomic volume fraction of Ag can be between 20-30 percent by weight. This is a compromise between having the Ag volume fraction sufficient enough to provide a large signal for detection purposes, but lower than a percolation threshold of approximately 50 percent such that dark properties are dominated by the silicon matrix. The composite film thickness can be about 3 to 10 microns, but preferably 3 microns.

The p-layer can be a p-type diamond film with a negative electron affinity surface layer. As shown in the FIGURE, bias voltages $V_1$, $V_2$ and $V_3$ have polarities as such to move electrons to the right. Although the conduction and valence band discontinuities, $\Delta E_c$ and $\Delta E_v$, are on the order of 3 volts, the n+–p silicon-diamond heterostructures constructed for diamond surface emission cathode studies, produced external photoemitted electrons with forward bias turn-on voltages of only 1 volt $(V_2)^5$. This is an important experimental verification of an essential feature necessary for the proper operation of the present detector.

The barrier height for electrons to escape from the metal particles embedded in the n-type semiconductor into the conduction band of the semiconductor (i.e., the Schottky barrier height), takes the place of the bandgap in the prior art in that the Schottky barrier is the threshold for the smallest energy to be detected. These buried Schottky barriers are also at least an order of magnitude more sensitive than planar structures formed from the same materials. The metal n-type semiconductor composite forms the n-partner of an n-p heterojunction. The microstructure of the metal-n-type semiconductor is configured to give the highest absorption in the desired wavelength band. The p-partner is p-type diamond whose surface has been made with a negative electron affinity, i.e., there is no barrier for electron emission into vacuum once they reach the conduction band of the diamond. The photoexcited electrons in the conduction band of the silicon are injected under forward bias into the diamond conduction band and subsequently photoemitted into a vacuum. Once the diamond surface is made to have a negative electron affinity by hydrogenation it does not loose this character when exposed to air.

A Schottky barrier height for this type of combination is typically close to 2 μm. However, if the Si is a heavily doped n-type, efficient tunneling of electrons from the Ag nanoparticles into the Si conduction band may take place under electric fields, allowing the detection of radiation at wavelengths much longer than 2 μm.

While the products and methods have been described in conjunction with specific embodiments, it is evident that many alternatives, modifications, and variations will be apparent to those skilled in the art in light of the foregoing description.

I claim:

1. An infrared external photoemissive detector, comprising:
    an n-p heterojunction comprising an n-type semiconductor layer and a p-layer;
    the n-layer semiconductor comprising doped silicon embedded with nanoparticles forming Schottky barriers; and
    the p-layer is a p-type diamond film.

2. The detector of claim 1, wherein the nanoparticles are about 20-30 atomic percentage metal particles having an average particle size of about 5-10 nm.

3. The detector of claim 2, wherein the metal particle is silver.

4. The detector of claim 1, wherein the p-layer has a surface layer that has a negative electron affinity.

5. The detector of claim 1, wherein the n-layer is in the range of about 3 μm to 10 μm thick.

6. The detector of claim 5, wherein the n-layer is about 3 μm thick.

7. The detector of claim 1, wherein the doped silicon is doped with elements selected from the list consisting of phosphorus and antimony.

* * * * *